United States Patent [19]

Ashtaputre et al.

[11] Patent Number: 5,349,536
[45] Date of Patent: Sep. 20, 1994

[54] METHOD FOR OPTIMALLY PLACING COMPONENTS OF A VLSI CIRCUIT

[75] Inventors: Sunil V. Ashtaputre, San Jose; Dale M. Wong, San Francisco, both of Calif.

[73] Assignee: VLSI Technology, Inc., San Jose, Calif.

[21] Appl. No.: 747,542

[22] Filed: Aug. 20, 1991

[51] Int. Cl.⁵ .............................................. G06F 15/60
[52] U.S. Cl. .................................. 364/491; 364/490; 364/489; 364/488
[58] Field of Search ................. 364/488, 489, 490, 491

[56] References Cited

U.S. PATENT DOCUMENTS

| 5,202,840 | 4/1993 | Wong | 364/490 |
| 5,222,031 | 6/1993 | Kaida | 364/491 |
| 5,229,953 | 7/1993 | Isozaki et al. | 364/490 |
| 5,237,514 | 8/1993 | Curtin | 364/490 |

OTHER PUBLICATIONS

"Partioning and Placement Technique for CMOS Gate Arrays" by Odaware et al., IEEE Trans. on Computer Aided Design, vol. CAD-6, No. 3, May 1987, pp. 355-363.

C. M. Fiduccia and R. M. Mattheyses, *A Linear-Time Heuristic for Improving Network Partitions* Proceedings of the 19th Design Automation Conference, 1982, pp. 241-247.

J. B. Lasserre, P. P. Varaiya, J. Walrand, *Simulated Annealing, Random Search, MultiStart or SAD?*, Systems and Control Letters 8 (1987) 297-301.

S. Kirkpatrick, C. D. Gelatt, M. P. Vecchi, *Optimization by Simulated Annealing*, Science, vol. 220, No. 4598, pp. 671-680, May 13, 1983.

*Primary Examiner*—Vincent N. Trans
*Attorney, Agent, or Firm*—Douglas L. Weller

[57] ABSTRACT

In a method for placement of components for a VLSI circuit, an initial number of current placements are selected. A greedy optimization is partially performed on each of the current placements. Then, a subset of the current placements which have been partially optimized is selected to be the new current placements. This selection is based on a global cost metric for the current placements. The global cost metric is, for example, based on the total length of all connection line networks for the circuit. The partial optimization and selection are repeated until there is only one current placement. Then, an optimization is performed on the remaining placement to obtain an optimized placement. The optimization is, for example, a completion of the partially performed greedy optimization.

20 Claims, 2 Drawing Sheets

METHOD FOR OPTIMALLY PLACING COMPONENTS OF A VLSI CIRCUIT

BACKGROUND

The present invention concerns the optimal placement of components of a very large scale integrated (VLSI) circuit.

In the design of VLSI circuits, circuitry consists of functional blocks of logic, often called components, which are interconnected by networks of connection lines. In order to most efficiently use space on a VLSI circuit, it is desirable to place components on the VLSI circuit so as to minimize a cost metric, for example, the total length of all connection lines between the components. In order to do this, in general, it is desirable to place components which are attached to the same connection line network in close proximity with one another. However, since the number of components is generally very large and the interconnections between components are exceedingly complex, an optimal placement of components can be difficult to find.

One method in the prior art is to make an initial placement of the components and then use a greedy algorithm to improve the initial placement. The initial placement may be done, for example, using a mincut algorithm such as that described in C. M. Fiduccia and R. M. Mattheyses, *A Linear-Time Heuristic for Improving Network Partitions,* Proceedings of the 19th Design Automation Conference, 1982, pp. 241-247. Once an initial placement is made, the greedy algorithm will check whether the cost metric is decreased by exchanging the location of various components. When the algorithm determines that the exchange does in fact lead to such a cost reduction, the exchange is made. The greedy algorithm is completed when exchanges no longer lead to a decrease in the cost metric.

One drawback to the use of a greedy algorithm is that the algorithm may find a local minimum in the cost metric, but not find the global minimum in the cost metric and thus the optimal placement of components. One attempt to overcome this shortcoming of greedy algorithms is to apply the greedy algorithm to a number of randomly selected initial placements. Using such a "multiple start" greedy algorithm, several local minima of the cost metric may be obtained which increase the chance the global minimum will be discovered. See for example, J. B. Lasserre, P. P. Varaiya, J. Walrand, *Simulated Annealing, Random Search, MultiStart or SAD?,* Systems and Control Letters 8 (1987) 297-301.

Alternately, other types of algorithms may be used. For example, a simulated annealing algorithm may be used which will, in the process of searching for a global minimum, allow for the exchange of location of various components which result in an increase in the cost metric. See for example, S. Kirkpatrick, C. D. Gelatt, M. P. Vecchi, *Optimization by Simulated Annealing,* Science, vol. 220, no. 4598, pp. 671-680, May 13, 1983. In effect the simulated annealing algorithms apply sufficient brute force to adequately sample the entire range of component placement configurations, and then very gradually narrow the search to a component placement arrangement which has a local "valley" with a low global cost metric.

The primary drawback of using placement schemes such as multiple start greedy algorithms or Simulated Annealing algorithms is that they require significant computer resources to perform. It is desirable, therefore to develop other algorithms which are able to generate a component placement with a global minimum cost metric which will not require so significant an amount of computer run time.

SUMMARY OF THE INVENTION

In accordance with the preferred embodiment of the present invention, a method is presented for placement of components for a VLSI circuit. In the method, an initial number of current placements are selected. A greedy optimization is partially performed on each of the current placements. Then, a subset of the current placements which have been partially optimized is selected to be the new current placements. This selection is based on a global cost metric for the current placements. The global cost metric is, for example, based on the total length of all connection line networks for the circuit. The partial optimization and selection are repeated until there is only one current placement. Then, an optimization is performed on the remaining placement to obtain an optimized placement. The optimization is, for example, a completion of the partially performed greedy optimization.

The partial performance of the greedy optimization may be, for example, a single pass through a greedy optimization algorithm which operates as follows. During each pass, a best location for the component is determined for each component. This determination is based on a local cost metric, such as the total length of connection line networks which are connected to the component. The component is then moved to the best location when doing so improves a current value for the global cost metric.

The number of initial placements selected and the percentage of current placements retained after each partial optimization influence both the computer time required to perform the method and the effectiveness of the method in locating an optimal placement. For example, for a very thoroughly optimized placement, the number of initial placements may be set approximately equal to the total number of components in the circuit, and half the current placements may be retained after each partial optimization. If it is desirable to limit the computer run time required, the number of initial placements may be significantly less than the total number of components in the circuit, and the percentage of the current placements retained may start out significantly less than fifty percent and increase when the number of current placements decreases.

The present invention provides for an efficient method for finding an optimized placement of components in a VLSI circuit. Further the method is extremely flexible, being tunable to offset computer run time verses the scope of a search. The method is additionally flexible in that the method may be interrupted at any point and the best current placement can be selected and optimized for an immediate solution.

DESCRIPTION OF THE PREFERRED EMBODIMENT

The present invention concerns placement of a circuit for a VLSI circuit. The logical circuitry and connections for a VLSI circuit is typically generated in the form of a netlist. The netlist includes logical components and connection networks between the logical components. Once a netlist is generated for a VLSI circuit, the placement of the components needs to be performed.

Figure 1:
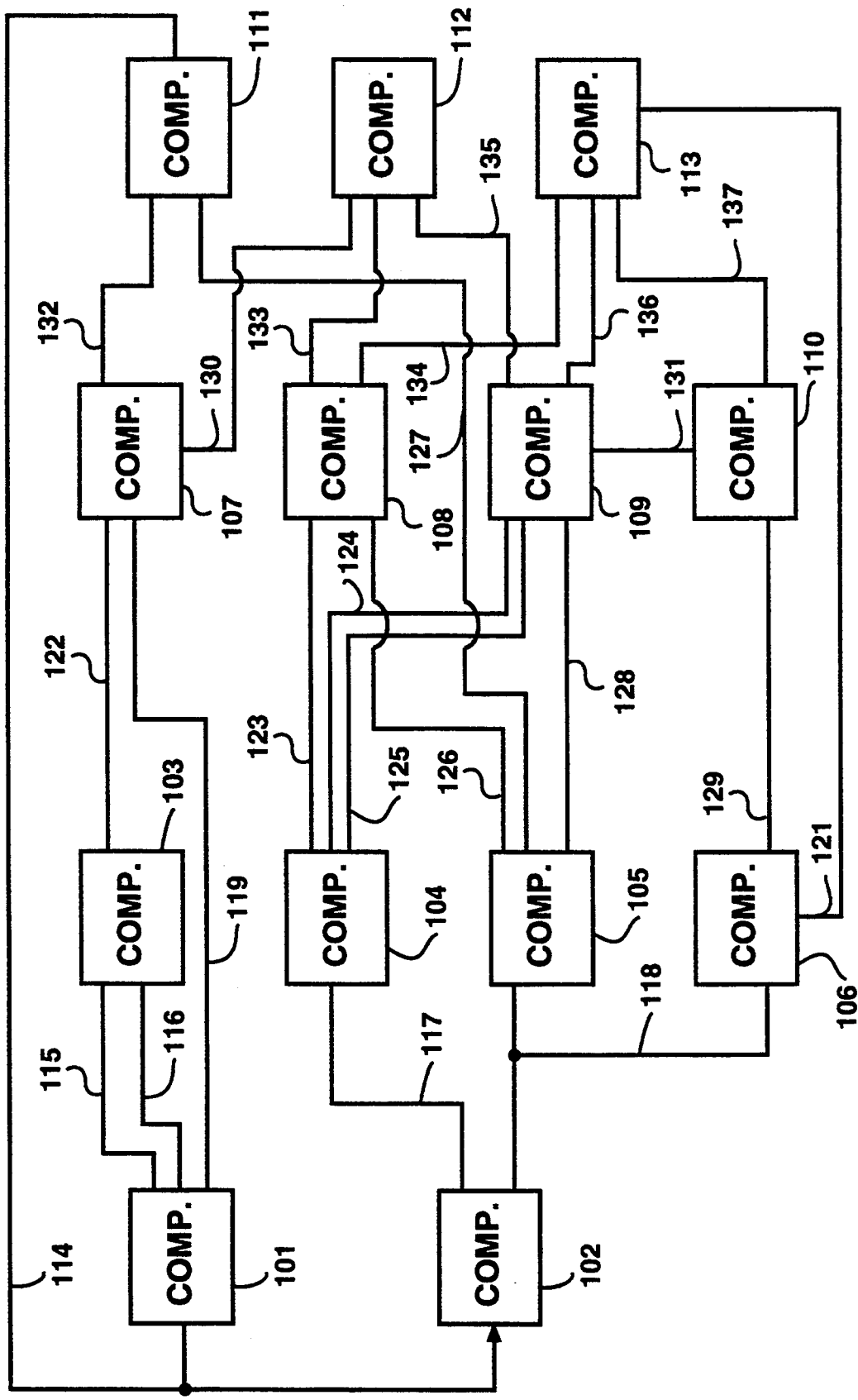
FIG. 1 is an extremely simplified circuit used to illustrate placement of components in a VLSI circuit.

FIG. 1 is an extremely simplified block diagram of interconnected components. Typically, the design of an integrated circuit may include many thousands of components with many thousands of connection lines between the components. In FIG. 1, an initial placement of components 101 through 113 is shown. A simplified routing of connection lines results in connection line networks 114 through 137 serving to interconnect components 101 through 113.

Once components 101 through 113 are initially placed, an optimization algorithm is used to find an optimal placement. In finding the optimal placement, it is desirable to find a global minimum of a cost metric. For example, the cost metric may be total connection line length. In this case, an optimization algorithm which was evaluating the cost metric of exchanging locations of a component 108 and component 109 would determine that such an exchange would increase the length of connection line network 123, connection line network 128, connection line network 131 and connection line network 136. However, the exchange would shorten connection line network 124, connection line network 125, connection line network 126 and connection line network 134. The length of connection line network 133 and connection line network 135 would remain the same. Based on the value of the calculated cost metric, the algorithm determines whether to make the exchange.

Figure 2:
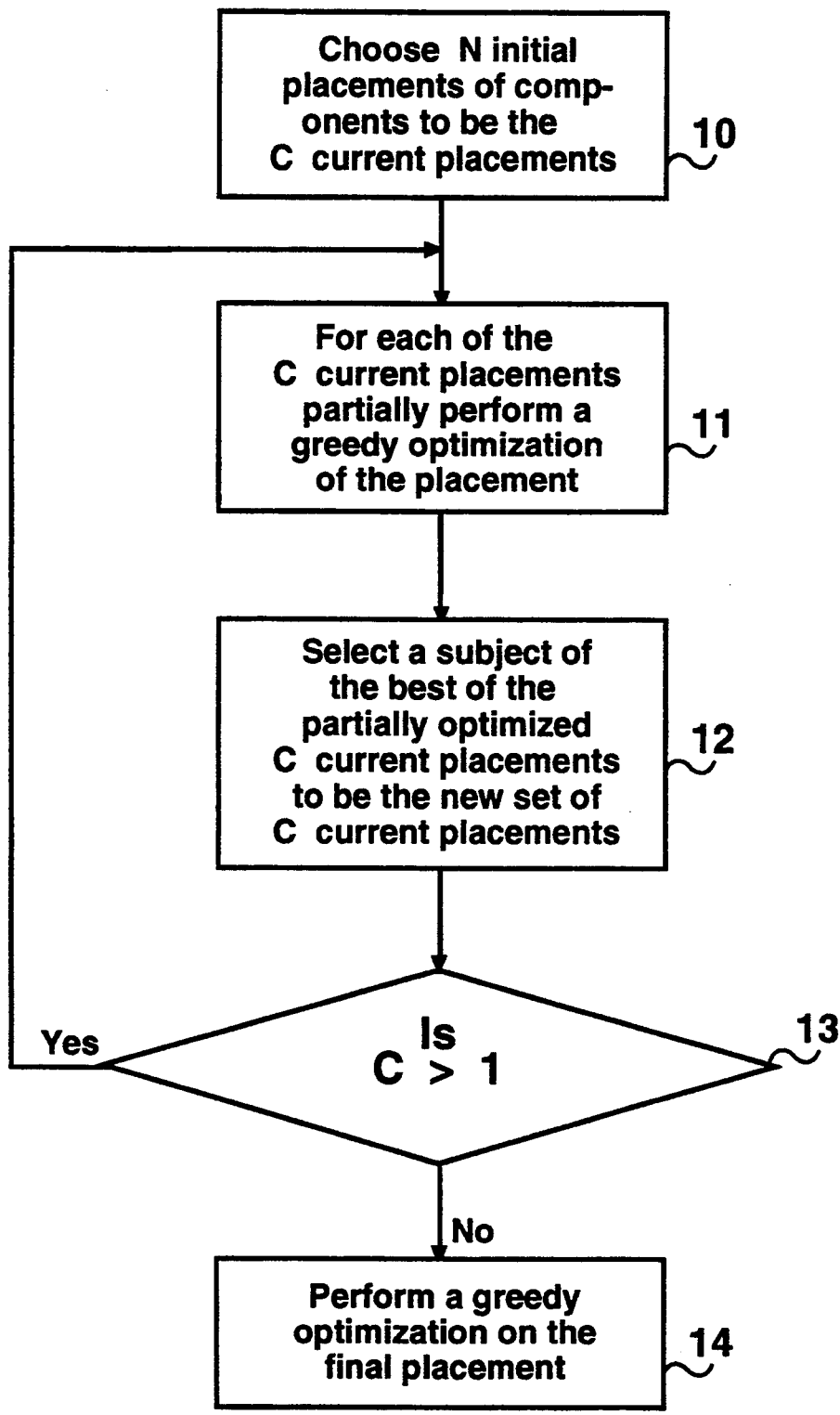
FIG. 2 is a flowchart which describes a method for the placement of components on a VLSI circuit in accordance with the preferred embodiment of the present invention.

FIG. 2 shows a flowchart which gives an overview of a method in accordance with the preferred embodiment of the present invention. In a step 10, "n" initial placements of components are randomly selected. The n initial randomly selected placements are initially considered to be the "c" current placements.

In a step 11, a greedy optimization is partially performed on each of the c current placements. The partial performance of the greedy optimization may, for example, be the performance of one or more passes of the greedy algorithm set out by the pseudo code given below:

---
Pseudo Code for Greedy Algorithm
---
For "p" passes (or until there is no further improvement):
  For each component of the circuit:
    Based on a local cost metric for the component (e.g., the total length of connection line networks which are connected to the component), select the best location for the component;
    If a value for the global cost metric for all components (e.g., the total length of all connection lines in the circuit) when the component is moved to the selected best location is less than a value for the global cost metric circuit when the component is not moved, move the component to the selected best location.
---

In a step 12, a subset of the partially optimized c current placements with the current lowest cost metric values are selected to be the new set of c current placements.

In a step 13, it is ascertained whether there is more than one placement in the set of c current placements. If so, step 11 through step 13 are repeated. Otherwise, in a step 14, a greedy optimization is performed on the remaining placement.

The actual computer run time of the above-described method varies with the number of initial placements and the number of placements which are kept as a subset of partially optimized current placements. For example, a typical VLSI circuit contains between 10,000 and 20,000 components. To thoroughly search out a global placement optimization, 10,000 initial randomly selected placements of components are chosen (i.e., $n=10,000$). Similarly, in step 11, a single pass of the greedy optimization algorithm may be performed for each of the c current placements. Also, in step 12, half of the c current placements are selected.

In the above described example, in step 10, c is equal to 10,000. In step 11, a first pass of the greedy optimization algorithm is performed for each of the 10,000 placements. In step 12, the 5,000 placements with the lowest cost metric are retained as the c current placements. Step 11 and step 12 are repeated until there remains only one current placement.

After a second pass of the greedy optimization algorithm in step 11, 2,500 placements are retained in step 12. After a third pass of the greedy optimization algorithm in step 11, 1,250 placements are retained in step 12. After a fourth pass of the greedy optimization algorithm in step 11, 625 placements are retained in step 12. After a fifth pass of the greedy optimization algorithm in step 11, 312 placements are retained in step 12. After a sixth pass of the greedy optimization algorithm in step 11, 156 placements are retained in step 12. After a seventh pass of the greedy optimization algorithm in step 11, 78 placements are retained in step 12. After a eighth pass of the greedy optimization algorithm in step 11, 39 placements are retained in step 12. After a ninth pass of the greedy optimization algorithm in step 11, 19 placements are retained in step 12. After a tenth pass of the greedy optimization algorithm in step 11, nine placements are retained in step 12. After a eleventh pass of the greedy optimization algorithm in step 11, four placements are retained in step 12. After a twelfth pass of the greedy optimization algorithm in step 11, two placements are retained in step 12. After a thirteenth pass of the greedy optimization algorithm in step 11, one placement is retained in step 12. In step 14, additional passes are made through the greedy optimization algorithm for the remaining placement until no further improvement is possible.

While the above example thoroughly searches out a global placement algorithm, run time can be substantially reduced by evaluating a smaller number of initial placements. For a more streamlined example, n may be chosen to be 720. Additionally, in step 12, only 1/t of the placements are retained. The value for t is initially 6 but is decremented for each successive pass through the greedy optimization algorithm.

In the above described example, in step 10, c is equal to 720. In step 11, a first pass of the greedy optimization algorithm is performed for each of the 720 placements. In step 12, the 120 (720/6) placements with the lowest cost metric are retained as the c current placements. Step 11 and step 12 are repeated until there remains only one current placement.

After a second pass of the greedy optimization algorithm in step 11, 24 (120/5) placements are retained in step 12. After a third pass of the greedy optimization algorithm in step 11, 6 (24/4) placements are retained in step 12. After a fourth pass of the greedy optimization algorithm in step 11, 2 (6/3) placements are retained in step 12. After a fifth pass of the greedy optimization algorithm in step 11, 1 (2/2) placement is retained in step 12. In step 14, additional passes are made through the greedy optimization algorithm for the remaining placement until no further improvement is possible.

At any point, the above-described method may be interrupted and the best current placement can be selected and optimized for an immediate solution. In general, the present invention provides for an efficient, flexible method for finding an optimized placement of components in a VLSI circuit.

The foregoing discussion discloses and describes merely exemplary methods and embodiments of the present invention. As will be understood by those familiar with the art, the invention may be embodied in other specific forms without departing from the spirit or essential characteristics thereof. Accordingly, the disclosure of the present invention is intended to be illustrative, but not limiting, of the scope of the invention, which is set forth in the following claims.

We claim:

1. A method comprising the steps of:
  (a) selecting an initial number of current placements of components for a VLSI circuit, including, for each of the initial current placements, selecting locations within the VLSI circuit for placement of each of the components;
  (b) for each of the current placements, changing locations of the components to improve the current placement so that the current placement is partially optimized in accordance with partial performance of a greedy optimization;
  (c) selecting a subset of the current placements partially optimized in step (b) to be new current placements, the selection being based on a global cost metric for the current placements;
  (d) when there are more than one new current placements, repeating steps (a) through (d) with the new current placements being the current placements;
  (e) when there is only one new current placement, performing an optimization on the new current placement to obtain an optimized placement; and,
  (f) manufacturing the VLSI circuit with the components of the VLSI circuit arranged in accordance with the optimized placement.

2. A method as in claim 1 wherein in step (b) the partial performance of the greedy optimization performed is a single pass through a greedy optimization algorithm in which for each pass, the following substeps are performed for each component:
  determining, based on a local cost metric, a best location for the component; and,
  moving the component to the best location when doing so improves a current value for the global cost metric.

3. A method as in claim 2 wherein in step (a) the initial number is approximately equal to a total number of components in the circuit and in step (c) approximately half the current placements are selected to be the new current placements.

4. A method as in claim 2 wherein in step (a) the initial number is significantly less than a total number of components in the circuit and in step (c) a percentage of the current placements are selected to be the new current placements, the percentage increasing when the number of current placements decreases.

5. A method as in claim 4 wherein in step (e) the optimization performed is a completion of the greedy optimization performed in step (b).

6. A method as in claim 2 wherein in step (e) the optimization performed is a completion of the greedy optimization performed in step (b).

7. A method as in claim 2 wherein the global cost metric is based on total length of all connection lines of the circuit.

8. A method as in claim 7 wherein the local cost metric is based on total length of all connection lines connected to the component.

9. A method as in claim 1 wherein in step (a) the initial number is approximately equal to a total number of components in the circuit and in step (c) approximately half the current placements are selected to be the new current placements.

10. A method as in claim 1 wherein in step (a) the initial number is significantly less than a total number of components in the circuit and in step (c) a percentage of the current placements are selected to be the new current placements, the percentage increasing when the number of current placements decreases.

11. A method as in claim 1 wherein in step (e) the optimization performed is a completion of the greedy optimization performed in step (b).

12. A method as in claim 1 wherein the global cost metric is based on total length of connection lines for the circuit.

13. A computer implemented method for placement of components for a VLSI circuit, the method comprising the steps, performed by a computer, of:
  (a) selecting an initial number of current placements, including for each of the initial current placements selecting locations within the VLSI circuit for placement of each of the components;
  (b) for each of the current placements, changing locations of the components to improve the current placement so that the current placement is partially optimized in accordance with partial performance of a greedy optimization;
  (c) selecting a subset of the current placements partially optimized in step (b) to be new current placements, the selection being based on a global cost metric for the current placements;
  (d) when there are more than one new current placements, repeating steps (a) through (d) with the new current placements being the current placements; and,
  (e) when there is only one new current placement, performing an optimization on the new current placement to obtain an optimized placement.

14. A computer implemented method as in claim 13 wherein in step (b) the partial performance of the greedy optimization performed is a single pass through a greedy optimization algorithm in which for each pass, the following substeps are performed for each component;
  determining, based on a local cost metric, a best location for the component; and,
  moving the component to the best location when doing so improves a current value for the global cost metric.

15. A computer implemented method as in claim 14 wherein in step (a) the initial number is approximately equal to a total number of components in the circuit and in step (c) approximately half the current placements are selected to be the new current placements.

16. A computer implemented method as in claim 14 wherein in step (a) the initial number is significantly less than a total number of components in the circuit and in step (c) a percentage of the current placements are selected to be the new current placements, the percentage increasing when the number of current placements decreases.

17. A computer implemented method as in claim 14 wherein in step (e) the optimization performed is a completion of the greedy optimization performed in step (b).

18. A computer implemented method as in claim 14 wherein the local cost metric is based on total length of all connection lines connected to the component.

19. A computer implemented method as in claim 13 wherein in step (a) the initial number is approximately equal to a total number of components in the circuit and in step (c) approximately half the current placements are selected to be the new current placements.

20. A computer implemented method as in claim 12 wherein in step (a) the initial number is significantly less than a total number of components in the circuit and in step (c) a percentage of the current placements are selected to be the new current placements, the percentage increasing when the number of current placements decreases.

* * * * *